(12) United States Patent
Minen

(10) Patent No.: US 10,410,536 B2
(45) Date of Patent: Sep. 10, 2019

(54) APPARATUS TO SIMULATE DRIVING A LAND VEHICLE

(71) Applicant: VI-GRADE AG, Romanshorn (CH)

(72) Inventor: Diego Minen, Udine (IT)

(73) Assignee: VI-GRADE AG, Romanshorn (CH)

( * ) Notice: Subject to any disclaimer, the term of this patent is extended or adjusted under 35 U.S.C. 154(b) by 393 days.

(21) Appl. No.: 14/375,050

(22) PCT Filed: Jan. 30, 2013

(86) PCT No.: PCT/IB2013/000112
§ 371 (c)(1),
(2) Date: Jul. 28, 2014

(87) PCT Pub. No.: WO2013/114179
PCT Pub. Date: Aug. 8, 2013

(65) Prior Publication Data
US 2015/0004567 A1    Jan. 1, 2015

(30) Foreign Application Priority Data

Jan. 30, 2012  (IT) .............................. UD2012A0011

(51) Int. Cl.
| | | |
|---|---|---|
| *G09B 9/04* | (2006.01) | |
| *G06F 17/50* | (2006.01) | |
| *G09B 19/16* | (2006.01) | |
| *G09B 1/34* | (2006.01) | |
| *G09B 19/08* | (2006.01) | |

(52) U.S. Cl.
CPC .......... *G09B 9/04* (2013.01); *G06F 17/5009* (2013.01); *G09B 19/167* (2013.01); *G09B 1/34* (2013.01); *G09B 19/08* (2013.01)

(58) Field of Classification Search
CPC ........ G09B 19/08; G09B 19/167; G09B 1/34; G09B 9/04; G06F 17/5009
USPC ........................................................... 434/62
See application file for complete search history.

(56) References Cited

U.S. PATENT DOCUMENTS

| | | | |
|---|---|---|---|
| 5,919,045 A | 7/1999 | Tagge et al. | |
| 2005/0042578 A1* | 2/2005 | Ammon | .................. G09B 9/04 434/62 |
| 2005/0069839 A1* | 3/2005 | Denne | ..................... A63F 13/08 434/29 |
| 2010/0122603 A1* | 5/2010 | Schubert | ............. G03F 7/70716 74/490.08 |
| 2010/0273132 A1* | 10/2010 | Dutt | ......................... G09B 9/14 434/29 |
| 2012/0123592 A1* | 5/2012 | Carignan | ................ A61F 2/468 700/275 |

* cited by examiner

*Primary Examiner* — Samchuan C Yao
*Assistant Examiner* — Jennifer L Korb
(74) *Attorney, Agent, or Firm* — Hamre, Schumann, Mueller & Larson, P.C.

(57) ABSTRACT

Apparatus to simulate driving a land vehicle comprising a fixed base platform, a mobile platform disposed above said base platform, a mobile driver's position, associated with the mobile platform and in which a driver has his seat during normal use, and movement means associated with the base platform and with the mobile platform to provide the movement of said mobile platform with respect to the base platform.

6 Claims, 7 Drawing Sheets

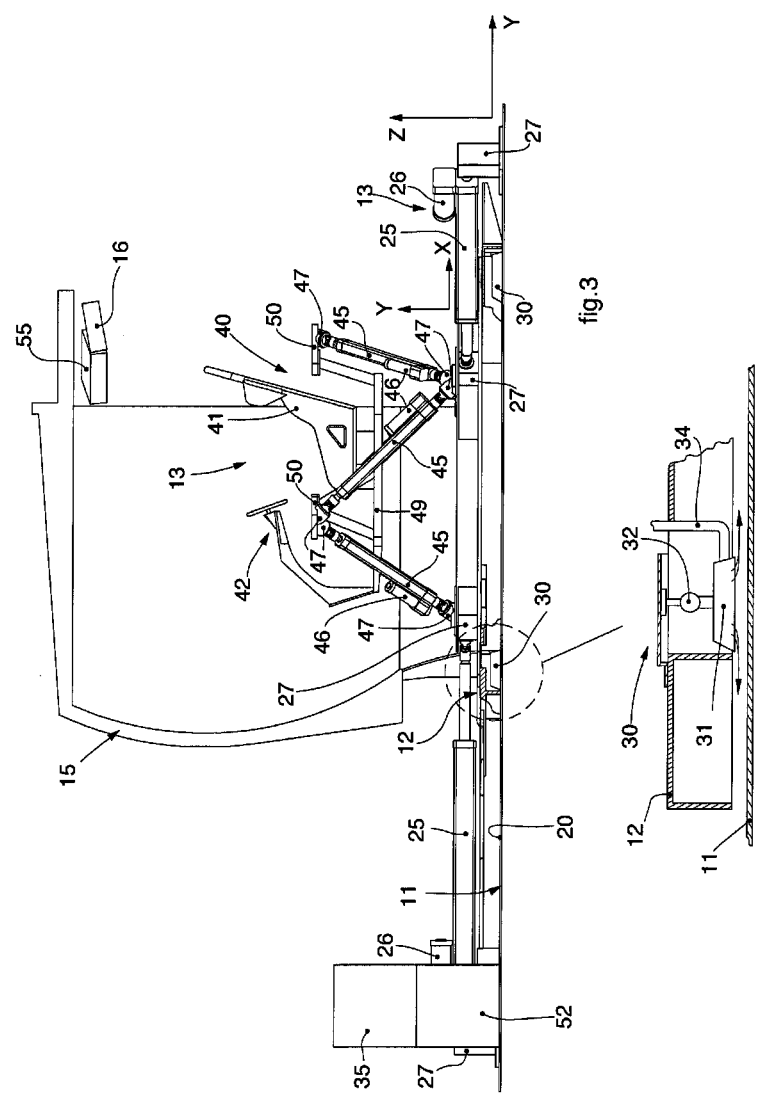

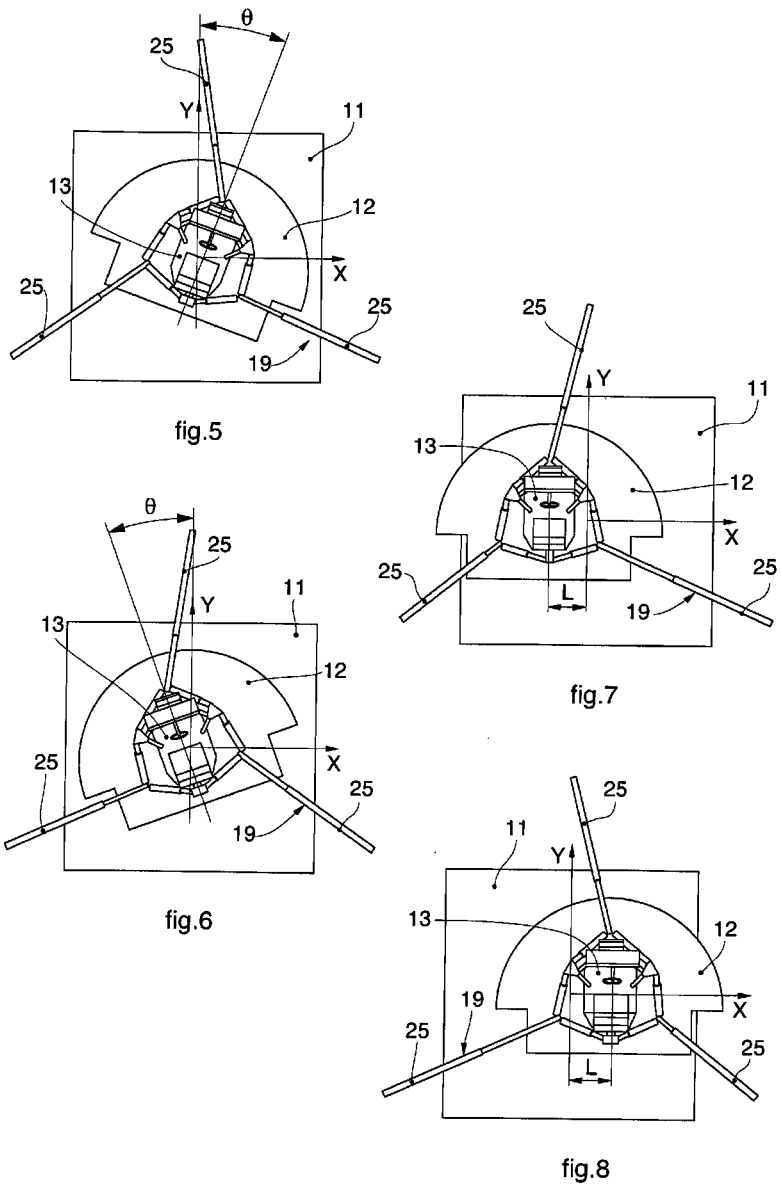

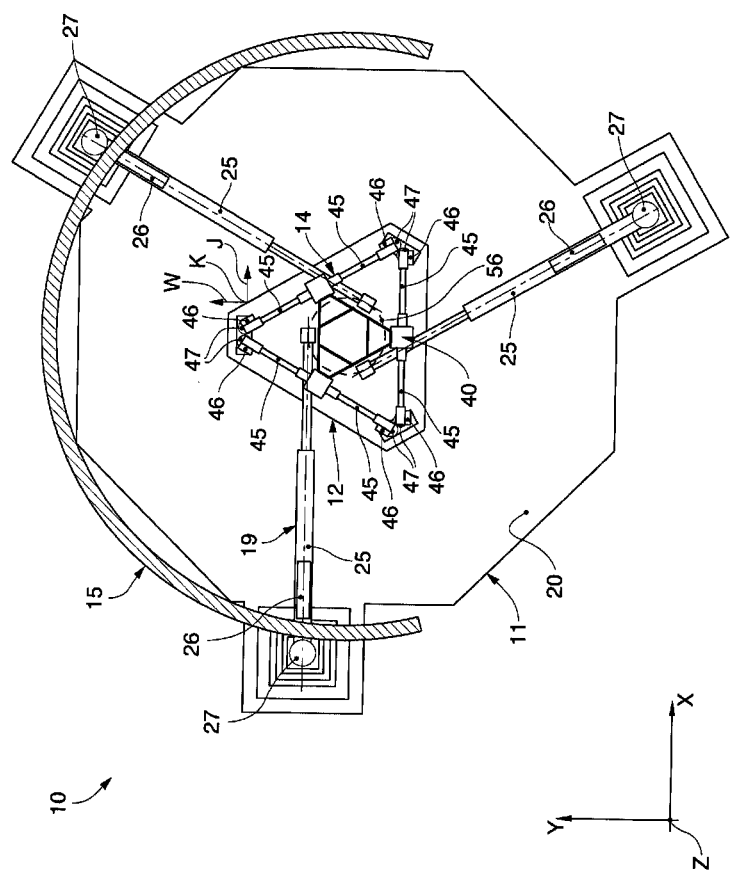

APPARATUS TO SIMULATE DRIVING A LAND VEHICLE

FIELD OF THE INVENTION

The present invention concerns an apparatus to simulate driving a land vehicle such as an automobile, a sports car, a bus, a truck or suchlike.

In particular, the apparatus is able to reproduce the driving conditions of one of the above vehicles along predetermined routes and in the driving manner determined by the driver.

The present invention can also be used for training staff to drive.

BACKGROUND OF THE INVENTION

Apparatuses are known to simulate driving land vehicles, which comprise a main frame with which are associated a seat element for the driver, command means actuated by the user such as a driving wheel, the brake, clutch and accelerator pedals and a projection screen onto which the driving environment where the driver is immersed during the simulation is projected.

The frame is selectively movable by a mechanical kinematism, which comprises a plurality of telescopic actuators, constrained to a fixed support base. The actuators provide to move the frame in space, both translating it along the three coordinated axes, and also providing rotations around said axes. In other words, the frame can be moved in all its six degrees of freedom.

These types of known simulation apparatus mostly derive from aeronautical applications and are not very suitable for simulations with land vehicles. This is because they have considerable limits in their performance and in their faithful reproduction of the sensations felt by a driver of a land vehicle. These disadvantages are due to the fact that the movements of a land vehicle require the spatial kinematism, for example with a hexapod architecture, to develop great accelerations in order to simulate yawing and longitudinal and lateral translations.

Developing great accelerations requires a large maneuvering space and therefore considerable travels of the actuators used, which could not in any case be reconciled, in production terms, for simulating driving on a land vehicle.

In fact, for a land vehicle, the movements that require to develop great accelerations are longitudinal translation, lateral translation and yawing.

On the contrary, given that the land vehicle is normally in contact with the ground, it does not have big movements of pitching, rolling or vertical translation.

The structural conformation of this known simulation device is therefore not optimum for the actions that it has to perform. It must also be added that these known simulation apparatuses are extremely bulky, in order to compensate for said limits.

In order to overcome these disadvantages, simulation apparatuses are also known which comprise a mobile base, translatable along guides disposed transverse with respect to each other, and which allow it to be moved on a plane. The frame is installed on the mobile base, and is movable by means of a hexapod-type kinematism as described above.

These known simulation apparatuses too, although they are developed to simulate driving land vehicles, are particularly bulky, complex to make and to manage, and particularly costly.

An apparatus is also known, to simulate driving a land vehicle, for example described in document U.S. Pat. No. 5,919,045 which also comprises a mobile base, sliding along two pairs of guides disposed transverse with respect to each other and in coordinated directions. A fifth wheel, on which the mobile base is mounted, is associated with one of the two pairs of guides.

The mobile base is translated along the guides in order to simulate the longitudinal and lateral translation, and can rotate around the fifth wheel, or around an axis of rotation orthogonal to the plane on which the guides lie, in order to simulate the yawing of a vehicle.

The frame is associated with the mobile base by means of kinematic mechanisms that determine the translation thereof along said axis of rotation and allow it to rotate around the directions of translation defined by the pairs of guides. The kinematic mechanisms therefore allow to simulate the effects of vertical movement, pitching and rolling which, in real solutions, are normally determined by the kinematics of suspensions.

However, the particular configuration of this known simulation apparatus has the disadvantage that it does not have a sufficient structural rigidity, it is difficult to scale up or down, given the same architecture, and it does not have any redundancy in its degrees of freedom.

Redundancy in the degrees of freedom, especially for simulation apparatuses with limited maneuvering spaces, would allow to return the frame to a neutral position, for example following a sudden acceleration in one direction, without giving an erroneous sensation of movement to the driver.

One purpose of the present invention is to obtain an apparatus for simulating driving a land vehicle that is relatively compact and not bulky.

Another purpose of the present invention is to obtain an apparatus that is simple to make and economical.

Another purpose of the present invention is to obtain an apparatus that has adequate structural rigidity, so as to adapt to the different driving conditions.

The Applicant has devised, tested and embodied the present invention to overcome the shortcomings of the state of the art and to obtain these and other purposes and advantages.

SUMMARY OF THE INVENTION

The present invention is set forth and characterized in the independent claims, while the dependent claims describe other characteristics of the invention or variants to the main inventive idea.

In accordance with the above purposes, an apparatus according to the present invention is used to simulate driving a land vehicle.

The apparatus according to the present invention comprises a fixed base platform, a mobile platform disposed above the base platform and a mobile driver's position, mounted on the mobile platform and where, during normal use, the driver sits.

With the driver's position there are also associated commands connected with driving, such as for example the driving wheel, the pedals and the dashboard, which can be selectively actuated by the driver, for example depending on the type of vehicle and the route in which he is immersed during the simulation, and on his style of driving.

The apparatus also comprises movement means associated with the base platform and with the mobile platform so as to move the latter, and hence the driver's position mounted thereon, with respect to the base platform.

According to one feature of the present invention, the base platform is provided with a flat support surface and the movement means are configured to allow the mobile platform to slide on the support surface of the base platform.

In this way, by means of the movement means, it is therefore possible to move the mobile platform, and hence the driver's position mounted thereon, with respect to the base platform, keeping it substantially parallel to the support surface. Moreover, in this case no complex movement mechanisms are necessary, such as longitudinal guides or fifth wheels, which due to their mechanical conformation have low rigidity and can therefore determine unwanted oscillations. The solution according to the present invention is not only simple to make but is also optimized in relation to the simulation of land vehicles.

According to another feature of the present invention, the movement means are configured, to allow the mobile platform to translate in a first direction, and in a second direction coordinated with respect to the first direction, and to rotate around a third direction normal to the support surface, in a coordinated manner with respect to the first and second direction. The translation of the mobile platform in the first direction can be provided for example to simulate a lateral movement of a vehicle. On the contrary, the translation of the mobile platform in the second direction can simulate a longitudinal acceleration/deceleration.

Instead, rotation around the third direction can simulate for example the effect of yawing of a vehicle.

The movement means are therefore suitable to control the three movements on a plane parallel to the support surface which normally, for the simulation of a land vehicle, require to develop great accelerations on a simulation apparatus.

According to one form of embodiment, the movement means comprise at least three linear actuators associated, with their respective ends, respectively with the base platform and the mobile platform.

The three actuators, because of how they are disposed, are suitable to provide at least to determine the three movements described above.

In other forms of embodiment it may be provided that the movement means comprise more than three actuators.

According to one form of embodiment, the actuators lie substantially on the same plane, which is parallel to the support surface and are disposed angularly spaced by 120° with respect to each other. This particular disposition allows to optimize the use of all the actuators considered.

According to another feature of the present invention, sliding means are associated with the mobile platform, to allow the latter to slide on the support surface of the base platform.

According to one form of embodiment, the sliding means comprise pneumostatic blocks which, generating an air gap between the base platform and themselves, allow to slightly lift the mobile platform to allow it to slide on the support surface.

According to a variant, the sliding means are chosen from a group comprising mechanical type bearings and magnetic type bearings.

According to another feature of the invention, the apparatus comprises a kinematic mechanism associated with the mobile platform and the driver's position so as to move the latter with respect to the mobile platform.

The kinematic mechanism is therefore able to simulate other movements that, with the movement means of the mobile platform as above, were not foreseeable. The kinematic mechanism is suitable to simulate, for example, the effects of suspension kinematics, like pitching, rolling and vertical oscillation of the vehicle.

According to another feature, the kinematic mechanism has a hexapod architecture, that is, a spider structure with six legs. This conformation allows to move the driver's position in all its six degrees of freedom available.

In this way, the simulation apparatus, considering the degrees of freedom of the mobile platform and the driver's position, has a redundancy in its degrees of freedom, that is, it has nine degrees of freedom of which three are redundant. The three redundant degrees of freedom are exploited by the present invention to return the mobile platform to a neutral condition, when for example some of the actuators of the movement means are in a position near to or maximum excursion. Their purpose is therefore to not allow the driver to perceive the return to the neutral position of the base platform. Furthermore, the redundancy allows to implement the movements on different frequencies, low or high, on the most appropriate movement system.

According to another form of embodiment, the kinematic mechanism comprises at least six linear actuators that are provided to move the driver's position in all its degrees of freedom.

The present invention also concerns a method to simulate driving a land vehicle that provides that a driver takes his place in a driver's position, associated with a mobile platform that is moved with respect to a lower fixed base platform.

The method according to the present invention provides to make the mobile platform slide on a support surface of the base platform.

BRIEF DESCRIPTION OF THE DRAWINGS

These and other characteristics of the present invention will become apparent from the following description of one form of embodiment, given as a non-restrictive example with reference to the attached drawings wherein:

FIG. 3 is a lateral view, partly in section, of FIG. 2;

FIG. 4 is a detailed view of a detail of FIG. 3;

FIGS. 5-10 are schematic and plan representations of the apparatus in FIG. 1, in different working positions;

FIG. 17 is a plan view of a variant of FIG. 2.

To facilitate comprehension, the same reference numbers have been used, where possible, to identify identical common elements in the drawings.

DETAILED DESCRIPTION OF ONE FORM OF EMBODIMENT

Figure 1:
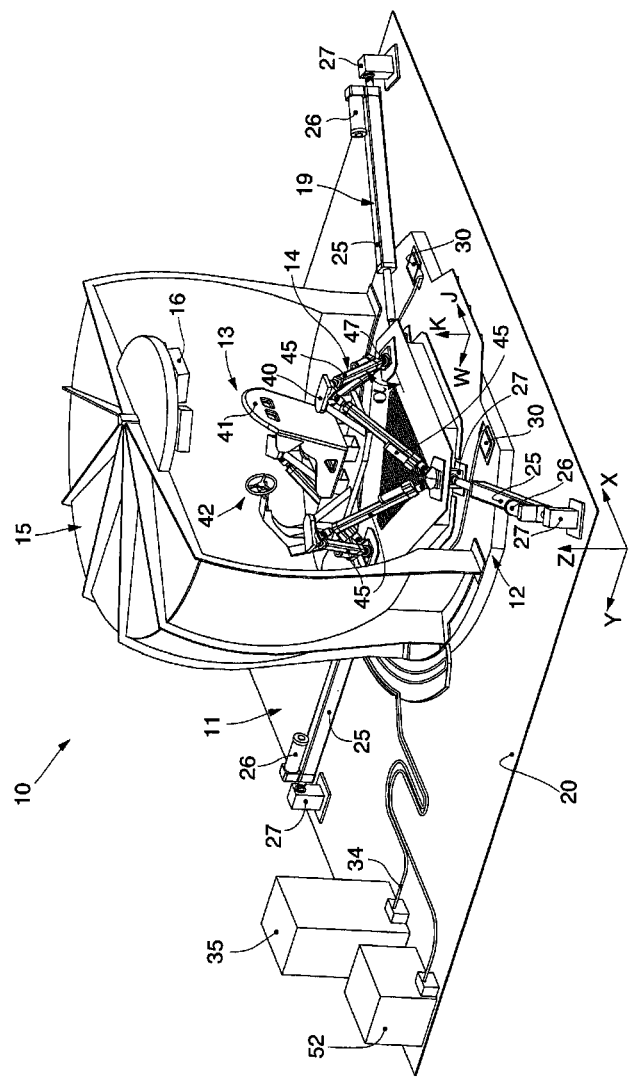
FIG. 1 is a perspective view of an apparatus for simulating driving a land vehicle according to the present invention.
Figure 2:
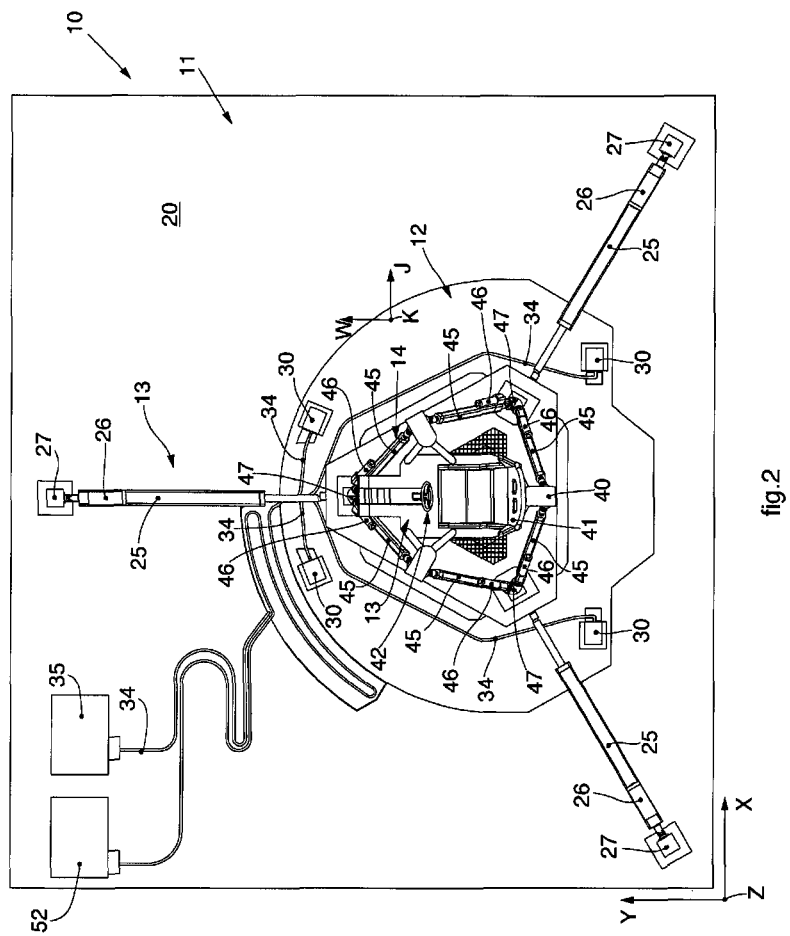
FIG. 2 is a plan view, partly in section, of FIG. 1.
Figure 9:
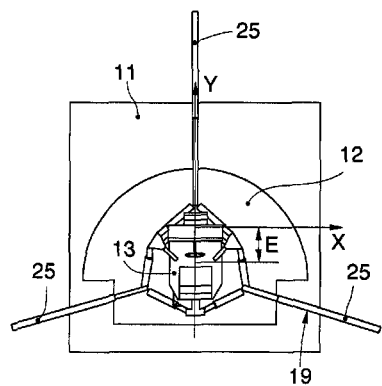
Figure 10:
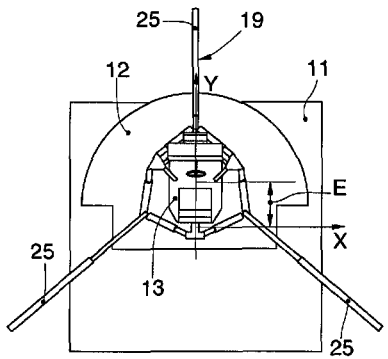
Figure 11:
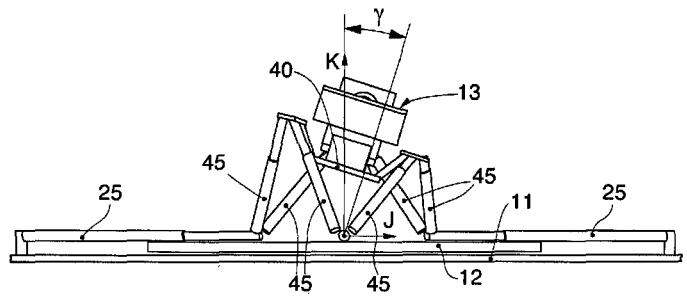
FIGS. 11 and 12 are schematic front representations of the apparatus in FIG. 1, in two different working positions.
Figure 12:
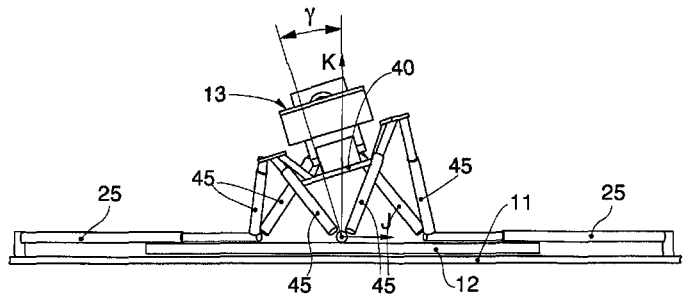
Figure 13:
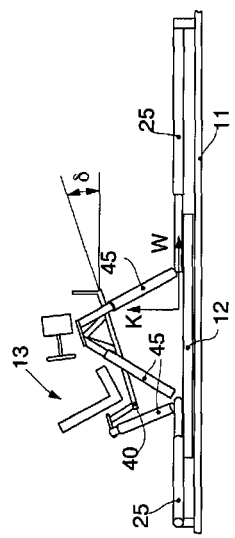
FIGS. 13-16 are schematic lateral representations of the apparatus in FIG. 1, in other working positions.
Figure 14:
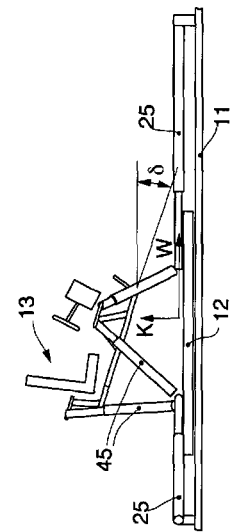
Figure 15:
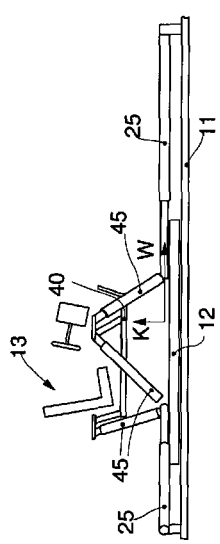
Figure 16:
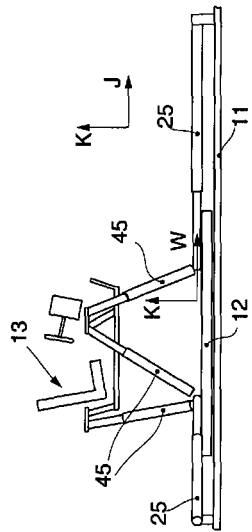

With reference to FIGS. 1-3, an apparatus to simulate driving a land vehicle according to the present invention is indicated in its entirety by the reference number 10, and comprises a fixed base platform 11, a mobile platform 12, and a driver's position 13 which is associated with the mobile platform 12 by means of a kinematic mechanism 14.

A projection screen 15 is mounted on the mobile platform 12, with a semi-spherical shell shape and images of the environment in which the driver is immersed during the driving are projected onto it using video projection devices 16.

Movement means 19 are associated with the base platform 11 and with the mobile platform 12 in order to move the latter on the base platform 11.

In particular the base platform 11 has a flat support surface 20 and the movement means 19 are configured to allow the mobile platform 12 to slide resting on the support surface 20 of the base platform 11.

The movement means 19 are provided to allow the mobile platform 12 both to translate on the plane defined by the support surface 20, that is, in a first direction X, and a second direction Y, coordinated with respect to the first direction X, and also to rotate around an axis parallel to a third direction Z which is coordinated with respect to the first direction X and the second direction Y, that is, orthogonal with respect to the support surface 20. The rotation of the mobile platform 12 around the third direction Z allows to simulate the yawing of a vehicle.

It is quite obvious that, combining the movements in the first direction X and the second direction Y, it is also possible to move the base platform 11 along other directions lying on the plane of the support surface 20.

With the movement means 19 it is therefore possible to control three of the six overall degrees of freedom of the mobile platform 12.

The movement means 19 in this case comprise three first linear actuators 25, for example of the type with recirculating balls, to define a very precise positioning of their travels. The actuators 25 are selectively actuated by respective electric motors 26.

The first actuators 25 are disposed at 120° with respect to each other, in this way allowing to optimize the translation performances in the first direction X and the second direction Y.

Moreover, the first actuators 25 are disposed with their axes, along which they exert their action of moving the mobile platform 12, that converge, on each occasion, toward a common intersection point comprised in the plan bulk of the mobile platform 12.

In other forms of embodiment (FIG. 17), which can be combined with the forms of embodiment shown here, the first actuators 25 are associated with the mobile platform 12 according to a different disposition with respect to that shown in FIGS. 1-16.

In this case, it is provided that the first actuators 25 are disposed so that their axes do not intersect at a single common intersection point. In the form of embodiment in FIG. 17, the first actuators 25 are disposed so that their axes are disposed, on each occasion during the movements of the mobile platform 12, tangent to a circumference 56 comprised in the bulk of the mobile platform 12. This configuration prevents the onset of dead points of the movement means 19 and therefore it is possible to obtain a more efficient apparatus 10.

At the opposite ends of each of the first actuators 25 spherical joints 27 are associated, fixed respectively to the base platform 11 and to the mobile platform 12.

The base platform 11 has a substantially rectangular shape, in this case square, with the sides 4 meters in size. In other forms of embodiment (FIG. 17) the base platform 11 is polygonal shaped, or octagonal, even if other shapes are not excluded.

The support surface 20 is suitably finished, for example by means of grinding and polishing, to make it extremely smooth and to allow the mobile platform 12 to slide on it.

The mobile platform 12 in this case has a substantially semicircular shape, even if other shapes cannot be excluded, such as for example triangular (FIG. 17), and sliding means 30 are associated with it which facilitate the sliding of the mobile platform 12 on the base platform 11.

The mobile platform 12 is provided in this case with four sliding means 30 (FIG. 2) disposed equidistant on the external perimeter of the mobile platform 12 in order to support it.

The sliding means 30 keep the mobile platform 12 in suspension on the base platform 11, avoiding the use of mechanical sliding means such as for example sliding guides, and sliding blocks on the sliding guides.

The sliding means 30 in this case comprise pneumostatic blocks 31 (FIGS. 3 and 4) which are disposed built-in in the thickness of the mobile platform 12.

The pneumostatic blocks 31 are associated with spherical pins 32 which allow them to be adapted to the load conditions which they must support so as to keep the mobile platform 12 parallel to the base platform 11.

The pneumostatic blocks 31 are attached to the mobile platform by means of brackets 33.

A flexible pipe 34 feeds the pneumostatic blocks 31 with compressed air generated by a compressed air generator 35.

The compressed air, fed by the compressed air generator 35, is made to exit continuously through the pneumostatic blocks 31 and lifts the mobile platform 12 from the base platform 11, facilitating the sliding thereof.

In other words, between the pneumostatic blocks 31 and the support surface 20 a film of air is defined which provides to support the mobile platform 12. During the movement of the mobile platform 12, it therefore slides on the film of air generated.

Merely by way of example, the film of air allows to lift the mobile platform 12 by a gap comprised between about 5 $\mu m$ and about 50 $\mu m$, advantageously by about 25 $\mu m$.

The particular finishing of the support surface 20 allows to prevent the onset of undesired vibrations in the mobile platform 12.

In other forms of embodiment, it can be provided that the sliding means 30 comprise elements of a mechanical type, such as for example ball bearings or elements of the magnetic type such as magnetic support bearings.

The driver's position 13 (FIGS. 1-3) comprises a frame 40, a seat 41 which is solidly associated with the frame 40, and command means 42 for the driver, such as for example a steering wheel, pedals, and a dashboard, not shown in the drawings.

The kinematic mechanism 14 is provided to move the frame 40 with respect to the mobile platform 12.

In this case, the kinematic mechanism 14 comprises a hexapod architecture, that is, provided with six second linear actuators 45 also of the type with recirculating balls and actuated by respective electric motors 46.

At opposite ends of each of the second actuators 45 spherical joints 47 (FIGS. 2 and 3) are associated, attached to the mobile platform 12 and respectively to the frame 40.

The frame 40 (FIG. 3) comprises a support plate 49 on which the seat 41 is mounted.

Support brackets 50 are attached to the support plate 49, and are disposed at the back and respectively in an intermediate position on the lateral flanks of the seat 41.

The spherical joints 47 for the articulation of the second actuators 45 are attached to the support brackets 50.

In particular, in correspondence to each of the support brackets 50, two of the second actuators 45 converge with their respective ends and, in a completely retracted position, are disposed inclined by an angle α (FIG. 1) with an amplitude comprised between 30° and 70°, preferably between 40° and 50°, with respect to the mobile platform 12.

The second actuators 45 therefore provide to move the frame 40 in all its six degrees of freedom. Indeed the frame 40 (FIGS. 1-3) can be translated in a fourth direction J, a coordinated fifth direction W, and a sixth direction K, coordinated with respect to the fourth J and to the fifth direction W. The hexapod mechanism also allows to control the rotations of the frame 40 around the fourth J, fifth W and sixth K directions.

It is therefore possible to compensate the movements which were not provided with the movement means 19, that is, the translation of the frame 40 along the sixth direction K which is parallel to the third direction Z, and the rotations of the same around axes parallel to the fourth J and fifth W directions. These three movements, in the actual solutions attributed to the suspension kinematics of vehicles, allow to simulate the effect of pitching, rolling and vertical movement.

It is quite obvious that, with the second actuators 45, it is possible to simulate the movements simulated by actuating the first actuators 25, although with lower margins of maneuver.

The kinematic mechanism 14 is therefore able to compensate the movement along the remaining three degrees of freedom which were not provided by the movement means 19 and to add another three redundant degrees of freedom which allow to optimize the movements of the apparatus 10.

The redundancy of said degrees of freedom, and therefore the configuration of the kinematic mechanism 14 of the hexapod type, allow to compensate the non-physical accelerations of translation in the first direction X, the second direction Y, and the rotation around the third direction Z due to the return of the mobile platform 12 into a neutral position, as well as to divide the movements as a function of the frequency content.

Indeed, following a sudden movement according to at least one of these three degrees of freedom as above, which are simulated by suitably actuating the first actuators 25, the latter find themselves in a position of maximum or minimum excursion, for obvious limits of size; this would not allow a subsequent simulation of a similar movement in that direction. It is therefore necessary, when necessary, to return to a neutral position given that, the more the movement along one axis is emphasized to give the correct inertial sensation to whoever is driving, the more there is a risk of causing an antithetical sensation to the driver and an incorrect repositioning of the mobile platform 12.

A processing and control device 52 controls the independent and synchronized actuation of the electric motors 26, 46 associated respectively with the first actuators 25 and the second actuators 45.

The processing and control device 52 implements mathematical algorithms inside it, also known as motion cueing algorithms, which allow to render as realistic as possible the functioning of the apparatus 10, when a driver is driving it.

In particular, as well as offering the driver a faithful reproduction of driving conditions, the mathematical algorithms are studied to suitably cause the movements for said repositioning of the mobile platform 12 in its neutral position. Moreover, depending on the commands given by the operator and on the databases inside the algorithm, the latter is able to recognize his style of driving and to update the movement control parameters of the mobile platform in order to maximize the instantaneous performances.

Detection means to detect their position, not shown in the drawings, are associated with each of the first 25 and second 45 actuators, which allow to optimize their movements.

It can also be provided that the mobile platform 12, and possibly the frame 40, are provided with proximity and reciprocal positioning sensors with respect to the base platform 11, or respectively to the mobile platform 12.

Sound reproduction devices 55, to reproduce in high fidelity the sounds of the vehicle during driving, are associated with the projection screen 15 and possibly with the projection device 16. Both the video projection device 16 and also the sound reproduction device 55 are managed by the processing and control device 52 which coordinates both the reproduction of images and sounds in relation to the driving modes set by the driver.

With reference to FIGS. 5-16, the functioning of the simulation apparatus 10 according to the present invention will now be described.

In the condition shown in FIG. 2, the mobile platform 12 is in a neutral position, that is, in a substantially centered position with respect to the base platform 11.

During the simulation of the vehicle yawing (FIGS. 5 and 6), the mobile platform 12 is rotated around an axis parallel to the third direction Z.

Merely by way of example, the base platform can complete a yawing angle θ, with respect to the second direction Y, with an amplitude comprised between ±20°.

During the simulation of a lateral translation of the vehicle (FIGS. 7 and 8), the mobile platform 12 is translated parallel to the first direction X by a determinate first travel L. Merely by way of example, the entity of the translation of the first travel L is about ±600 mm with respect to the neutral position.

During the simulation of a longitudinal translation (FIGS. 9 and 10), the mobile platform 12 is translated parallel to the second direction Y by a determinate second travel E, the entity of which, merely by way of example, is similar to that of the first travel L. With the second actuators 45, it is possible to simulate both movements that are similar to those which can be simulated with the first actuators 25 and also other movements not provided and as described above, which can be traced to the suspension kinematics of the vehicle.

In particular (FIGS. 11 and 12), it is possible to simulate a rolling effect of the vehicle by rotating the frame 40 around the fifth direction W. Merely by way of example, the frame 40 can be rotated by a rolling angle γ which has an amplitude comprised between ±20°.

To simulate the pitching of the vehicle (FIGS. 13 and 14), it is provided to rotate the frame 40 around the fourth direction J. Merely by way of example, the frame 40 can be rotated by a pitching angle δ with an amplitude comparable to that indicated for the rolling angle γ.

The vertical translation of the frame 40 (FIGS. 15 and 16) with respect to the mobile platform 12 provides a movement in the sixth direction K. The maximum translation that the frame can make, merely by way of example, is about 400 mm.

The particular hexapod configuration of the second actuators 45 also allows the translations of the frame 40 in the fourth J and fifth W directions, with a maximum travel of about ±100 mm. It is also possible to provide a simulation of the yawing effect by rotating the frame 40 around the sixth direction K with a yawing angle which in this case is about ±5.

It is clear that modifications and/or additions of parts may be made to the apparatus to simulate driving a vehicle as described heretofore, without departing from the field and scope of the present invention.

The invention claimed is:

1. An apparatus to simulate driving a land vehicle, comprising:
a fixed base platform, wherein the fixed base platform is provided with a flat support surface;
a mobile platform disposed above said fixed base platform on said flat support surface;
a mobile driver's position associated with the mobile platform, wherein said mobile driver's position includes a seat for a driver;
movement means associated with the fixed base platform and the mobile platform,
wherein said movement means are configured to allow said mobile platform to slide on said flat support surface,
said movement means including three first linear actuators associated with respective ends of said fixed base platform and respectively to said mobile platform,
wherein each of said three first linear actuators are disposed on a plane parallel to said flat support surface,
wherein said three first linear actuators are configured to translate said mobile platform in a first direction, translate said mobile platform in a second direction coordinated with respect to the first direction, and rotate said mobile platform around a third direction normal to said flat support surface and coordinated with respect to the first direction and the second direction in order to simulate great accelerations in surge, sway, and yaw movements associated with driving the land vehicle;
a kinematic mechanism disposed entirely above said mobile platform,
said kinematic mechanism being associated with said mobile platform and with said mobile driver's position to move the mobile driver's position with respect to the mobile platform,
said kinematic mechanism comprising six second linear actuators provided to move said mobile driver's position in all six degrees of freedom; and
a processing and control device configured to control independent and synchronized actuation of electric motors associated respectively with the first linear actuators and the second linear actuators,
wherein said processing and control device is configured to implement mathematical algorithms comprising motion cueing algorithms.

2. The apparatus as in claim 1, wherein said first linear actuators are disposed so that their respective axes, along which they exert their action of moving the mobile platform, are tangent to a common circumference comprised in the bulk of said mobile platform.

3. The apparatus as in claim 1, further comprising sliding means associated with said mobile platform that slides said mobile platform on said support surface.

4. The apparatus as in claim 3, wherein said sliding means comprise pneumostatic blocks.

5. The apparatus as in claim 3, wherein said sliding means are chosen from a group comprising bearings of the mechanical type and bearings of the magnetic type.

6. A method of using an apparatus to simulate driving a land vehicle, comprising:
providing the apparatus, the apparatus comprising:
a fixed base platform, wherein the fixed base platform is provided with a flat support surface;
a mobile platform disposed above said fixed base platform on said flat support surface;
a mobile driver's position associated with the mobile platform, wherein said mobile driver's position includes a seat for a driver;
movement means associated with the fixed base platform and the mobile platform,
wherein said movement means are configured to allow said mobile platform to slide on said flat support surface,
said movement means including three first linear actuators associated with respective ends of said fixed base platform and respectively to said mobile platform,
wherein each of said three first linear actuators are disposed on a plane parallel to said flat support surface,
wherein said three first linear actuators are configured to translate said mobile platform in a first direction, translate said mobile platform in a second direction coordinated with respect to the first direction, and rotate said mobile platform around a third direction normal to said flat support surface and coordinated with respect to the first direction and the second direction in order to simulate great accelerations in surge, sway, and yaw movements associated with driving the land vehicle;
a kinematic mechanism disposed entirely above said mobile platform,
said kinematic mechanism being associated with said mobile platform and with said mobile driver's position to move the mobile driver's position with respect to the mobile platform,
said kinematic mechanism comprising six second linear actuators provided to move said mobile driver's position in all six degrees of freedom; and
a processing and control device configured to control independent and synchronized actuation of electric motors associated respectively with the first linear actuators and the second linear actuators,
wherein said processing and control device is configured to implement mathematical algorithms comprising motion cueing algorithms;
moving the driver's position with respect to the lower fixed base platform in order to simulate great accelerations in surge, sway, and yaw movements associated with driving the land vehicle by actuating the three first linear actuators to:
slide said mobile platform on the flat support surface of said lower fixed base platform;
translate the mobile platform in the first direction and the second direction coordinated with respect to the first direction; and
rotate the mobile platform around the third direction normal to said flat support surface and coordinated with respect to the first direction and the second direction;
moving said mobile driver's position with respect to the mobile platform in all six degrees of freedom with the six linear actuators of the kinematic mechanism;
controlling the independent and synchronized actuation of the electric motors associated respectively with the first linear actuators and the second linear actuators with the processing and control device; and implementing the mathematical algorithms comprising the motion cueing algorithms using said processing and control device.

\* \* \* \* \*